United States Patent
He et al.

(10) Patent No.: US 7,816,726 B2
(45) Date of Patent: Oct. 19, 2010

(54) NONVOLATILE MEMORIES WITH LATERALLY RECESSED CHARGE-TRAPPING DIELECTRIC

(75) Inventors: Yue-Song He, San Jose, CA (US); Len Mei, San Jose, CA (US)

(73) Assignee: ProMOS Technologies Pte. Ltd., Singapore (SG)

(*) Notice: Subject to any disclaimer, the term of this patent is extended or adjusted under 35 U.S.C. 154(b) by 273 days.

(21) Appl. No.: 11/961,183

(22) Filed: Dec. 20, 2007

(65) Prior Publication Data
US 2009/0159957 A1 Jun. 25, 2009

(51) Int. Cl.
*H01L 29/792* (2006.01)
(52) U.S. Cl. .............. 257/324; 257/E29.309; 438/591
(58) Field of Classification Search .......... 257/324
See application file for complete search history.

(56) References Cited

U.S. PATENT DOCUMENTS

| 5,780,341 | A | 7/1998 | Ogura |
| 6,177,318 | B1 | 1/2001 | Ogura et al. |
| 6,355,524 | B1 | 3/2002 | Tuan et al. |
| 6,936,884 | B2 | 8/2005 | Chae et al. |
| 7,067,373 | B2 | 6/2006 | Shukuri |
| 2005/0141285 | A1 | 6/2005 | Jung |
| 2006/0086970 | A1* | 4/2006 | Kim ............... 257/321 |
| 2006/0170034 | A1* | 8/2006 | Park et al. ........ 257/324 |
| 2006/0205148 | A1* | 9/2006 | Deppe et al. ...... 438/257 |
| 2006/0245246 | A1 | 11/2006 | Lung |
| 2006/0261401 | A1* | 11/2006 | Bhattacharyya ... 257/316 |
| 2007/0029601 | A1 | 2/2007 | Orimoto et al. |
| 2007/0145455 | A1 | 6/2007 | Yasui et al. |
| 2007/0164352 | A1 | 7/2007 | Padilla et al. |
| 2009/0206387 | A1* | 8/2009 | Kang et al. ....... 257/324 |
| 2009/0251972 | A1* | 10/2009 | He et al. ........ 365/185.28 |

FOREIGN PATENT DOCUMENTS

WO     2004/077498     9/2004

OTHER PUBLICATIONS

U.S. Appl. No. 11/872,477, filed Oct. 15, 2007 by Yue-Song He et al., 22 pages.

* cited by examiner

*Primary Examiner*—Benjamin P Sandvik
(74) *Attorney, Agent, or Firm*—Haynes and Boone, LLP; Michael Shenker

(57) ABSTRACT

Charge-trapping dielectric (160) in a nonvolatile memory cell is recessed from under the control gate's edge and/or from an edge of a substrate isolation region. The recessed geometry serves to reduce or eliminate charge trapping in regions from which the charge may be difficult to erase.

23 Claims, 8 Drawing Sheets

NONVOLATILE MEMORIES WITH LATERALLY RECESSED CHARGE-TRAPPING DIELECTRIC

BACKGROUND OF THE INVENTION

The present invention relates to charge-trapping memories, and more particularly to the structure of charge-trapping dielectric.

The state of a charge trapping memory cell is defined by electric charge stored in the cell's charge-trapping dielectric (e.g. silicon nitride). Reliable operation requires good control over storing and erasing the charge in the charge-trapping dielectric. For example, if the charge cannot be reliably erased, the memory characteristics gradually change, and the memory may become inoperable after a small number of the programming/erase cycles. See U.S. Pat. No. 7,067,373 B2, issued Jun. 27, 2006 to Shukuri. The erase reliability can be improved by increasing the erase time, but this is undesirable if fast operation is needed.

SUMMARY

This section summarizes some features of the invention. Other features are described in the subsequent sections. The invention is defined by the appended claims, which are incorporated into this section by reference.

The inventors have observed that the erase reliability may suffer if the active area is oxidized below the edges of the charge trapping dielectric. In particular, if the charge must be erased by transfer of charge to the active area (e.g. to the channel region), the charge trapped at the edges of the charge-trapping dielectric above the oxidized active area may be difficult to erase.

Consider for example a memory fabrication process illustrated in FIGS. 1 and 2. Active area 104 consists of source, drain and channel regions formed in a P-type well of a semiconductor substrate 110 (e.g. monocrystalline silicon). A layer 150 (e.g. silicon dioxide) is formed on the substrate to provide tunnel dielectric. Charge-trapping dielectric 160 (e.g. silicon nitride) is formed on tunnel dielectric 150. Blocking dielectric 180 (e.g. silicon dioxide or aluminum oxide) is formed on trapping dielectric 160. A conductive layer 190 (e.g. doped polysilicon) is formed on blocking dielectric 180. A cap layer 194 (e.g. silicon nitride) is formed on layer 190. Layers 194, 190, 180, 160, 150 are patterned in one or more etching steps to provide the structure shown in FIG. 1.

This structure can be subjected to thermal oxidation to repair the etch damage to control gate 190 and/or substrate 110. FIG. 2 shows silicon dioxide layer 210 formed as a result (layer 210 may or may not be formed over the non-silicon surfaces, e.g. the surfaces of dielectric layers 194, 180, 160, 150, depending on the material of these layers). Lateral diffusion of oxygen causes oxidation of substrate 110 under the edges of charge-trapping dielectric 160, as shown at 210C.

N+ type source/drain regions 130, 140 are formed in the active area.

Suppose for example that the memory cell is programmed by channel hot electron injection (CHEI). In this operation, control gate 190 is driven to a positive voltage relative to the P well in substrate 110, and a voltage difference is provided between source/drain regions 130, 140. Hot electrons tunnel through dielectric 150 and are trapped in dielectric 160, possibly above oxide 210C. Oxide 210C complicates erasing of these electrons to active area 104. In particular, if tunnel dielectric 150 is thin (e.g. below 2.5 nm), the erasure can be performed by direct tunneling. Direct tunneling is advantageous because it can be performed at lower voltages than Fowler-Nordheim (FN) tunneling, and because it does not rely on hot carriers (as does hot electron injection). However, the direct tunneling current is highly dependent on the thickness of the dielectric through which the electrons are tunneled. Therefore, the increased thickness presented by oxide 210C is highly undesirable. The increased thickness may also be undesirable if other erase mechanisms are used, e.g. FN tunneling or hot hole injection.

In some embodiments of the present invention (see e.g. in FIG. 3), the charge trapping dielectric 160 is recessed away from the edges of control gate 190. Therefore, less or no charge is trapped above oxide 210C, and hence the erase operation is facilitated. Dielectric 160 can be recessed by a wet etch performed at the stage of FIG. 1. In some embodiments, this etch is selective to tunnel dielectric 150, blocking dielectric 180, and control gate 190 (for example, if charge-trapping dielectric 160 is silicon nitride, and layers 150, 180 are silicon dioxide). However, such selectivity is unnecessary. For example, if the etch removes part of tunnel dielectric 150, the tunnel dielectric can be restored during fabrication of oxide 210 (FIG. 3) and/or at some other steps. At any rate, the etched-out portion of trapping dielectric 160 can be replaced with some other material which would not trap any charge or would trap less charge. For example, such material may include a dielectric with a low charge-trapping density (e.g. silicon dioxide).

In some embodiments, the tunnel dielectric is recessed only at one but not both edges of control gate 190 (for example, only at the left edge). In some embodiments, the dielectric is recessed at a portion of the edge, not at a whole length of the edge.

The invention is not limited to the wet etch at the stage of FIG. 1. The recess in the charge trapping dielectric can defined at other stages, for example before the deposition of layer 190.

The invention includes split-gate memories, multi-state memory cells, and includes memories erased by FN tunneling or hot hole injection. The invention does not rely on any theory of operation, and in particular does not rely on the understanding or theory of the erase mechanism.

The invention is not limited to the features and advantages described above. Other features are described below. The invention is defined by the appended claims.

DESCRIPTION OF SOME EMBODIMENTS

The embodiments described in this section illustrate but do not limit the invention. The invention is defined by the appended claims. In particular, the invention is not limited to specific dimensions, materials, voltages, or fabrication processes except as defined by the appended claims.

Figure 4A:
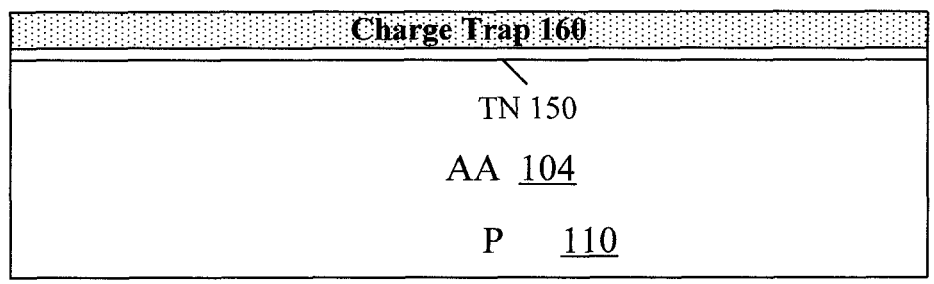
Figure 4B:
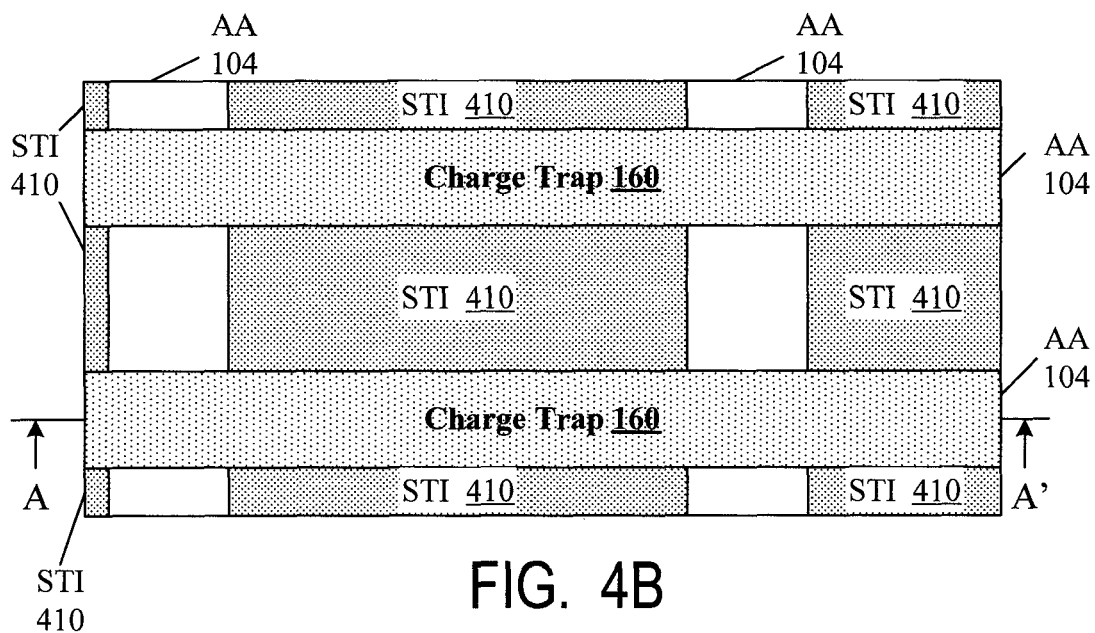
FIG. 4B is a top view of the nonvolatile memory of FIG. 4A in the process of fabrication.

Some embodiments of the present invention include split-gate memories, e.g. SG-SOROS (Split-Gate Silicon-oxide-nitride rich-oxide-silicon) described in U.S. patent application Ser. No. 11/872,477 filed Oct. 15, 2007 by Yue-Song He et al. and incorporated herein by reference. Some embodiments are believed to be highly advantageous for fabrication processes with the minimal photolithographic line width of 180 nm and below (e.g. for 90 nm). FIGS. 4A, 4B illustrate the beginning fabrication stages of a NOR array of SG-SOROS memory cells which incorporates an embodiment of the present invention. Fabrication steps not pertinent to the present invention are not described. The invention is not limited to NOR arrays or any other arrays, and may include a single memory cell or any combination of such cells and/or other types of cells. Exemplary materials and dimensions given below are for illustration purposes only.

As shown in FIG. 4A (vertical cross section) an isolated P well is formed in monocrystalline silicon substrate 110. The P well will include the memory array's active areas 104. Tunnel dielectric 150 is formed on the memory active areas 104. In some exemplary, non-limiting embodiments, dielectric 150 is silicon dioxide thermally grown to a thickness of 15-25 Å (angstroms), e.g. 21 Å. This thickness range is suitable for direct tunneling, but thicker dielectric can also be formed, especially if direct tunneling is not relied upon.

Charge trapping dielectric 160 is deposited on tunnel dielectric 150. In some embodiments, charge trapping dielectric 160 is silicon-rich silicon nitride ($Si_xN_y$, x:y>3:4) formed by chemical vapor deposition (CVD) to a thickness of 50-70 Å (e.g. 60 Å).

Layers 150, 160 are patterned using a single photolithographic mask (not shown). The top view of the resulting structure is shown in FIG. 4B, in which the cross sectional plane of FIG. 4A is marked as A-A'. FIGS. 4A, 4B are not necessarily to scale and are not necessarily on the same scale. In this embodiment, layers 150, 160 form a number of stacks. Each stack runs across the memory array in the bitline direction. An array of field isolation regions 410 positioned between the stacks of layers 150, 160 may be formed by LOCOS, shallow trench isolation (STI), or some other process. In some embodiments, field regions 410 are formed by STI before the deposition of tunnel dielectric 150 (before the stage of FIG. 4A) or after the etch of layers 150, 160, possibly using the same masks as for these layers. See U.S. Pat. No. 6,355,524 B1 issued Mar. 12, 2002 to Tuan et al. and describing a floating gate memory which a similar geometry of STI regions. In some embodiments (not shown in FIG. 4B), layers 150, 160 cover the entire active area 104, which is a continuous area surrounding the field regions 410.

Figure 5A:
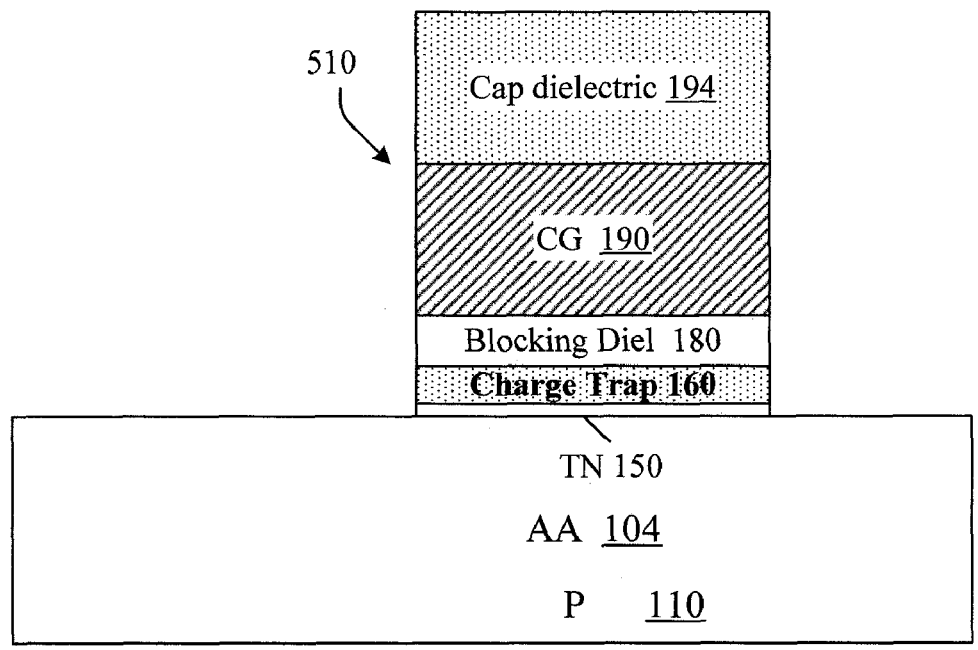
FIG. 5A shows a vertical cross section of a nonvolatile memory in the process of fabrication.
Figure 5B:
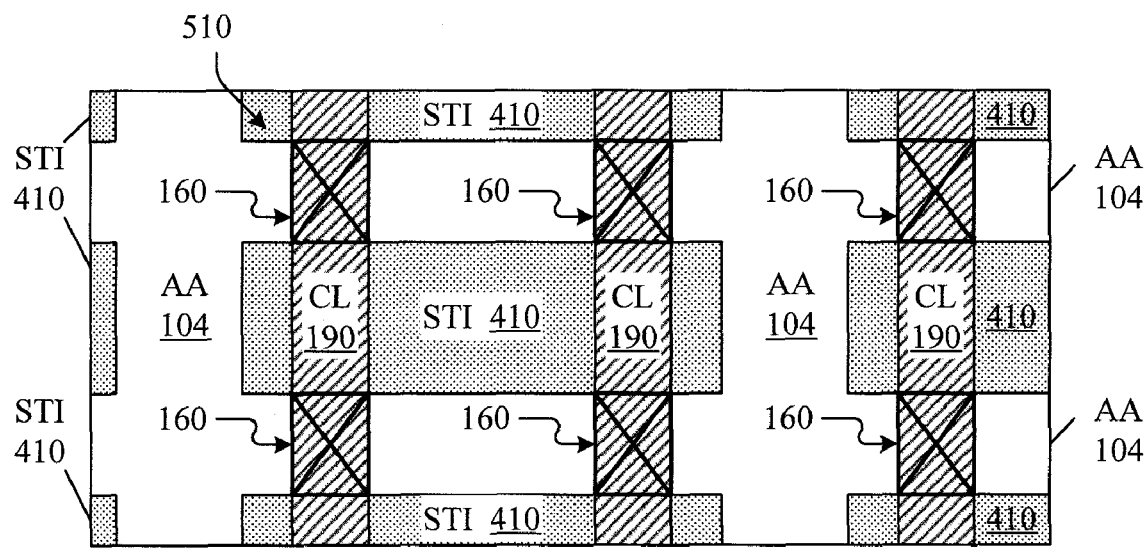
FIG. 5B is a top view of the nonvolatile memory of FIG. 5A in the process of fabrication.

As shown in FIG. 5A (vertical cross section by the same plane A-A' as for FIG. 4A), blocking dielectric 180, e.g. silicon dioxide of 70-90 Å thickness (e.g. 80 Å) is deposited on the wafer. Conductive layer 190 (e.g. doped polysilicon or a combination of polysilicon with other conductive layers) is deposited on the wafer to provide control gates. Then cap layer 194 (e.g. silicon nitride) is deposited and patterned to provide a hard mask for a subsequent etch. This etch removes layers 190, 180, 160, 150, stopping on substrate 110 and, possibly, on silicon dioxide of regions 410. FIG. 5B is the top view of control gates 190. FIG. 5B is drawn to a smaller scale than FIG. 5A. The positions of charge-trapping dielectric 160 are shown with crosses. Each control gate line 190 runs across the memory array in the wordline direction and provides control gates to one row of memory cells. Each line 190 is part of a stack 510 which includes also cap dielectric 194 and the underlying charge-trapping dielectric regions 160, blocking dielectric regions 180, and tunnel dielectric regions 150 for one row of memory cells. Each field region 410 underlies two adjacent stacks 510.

Figure 1:
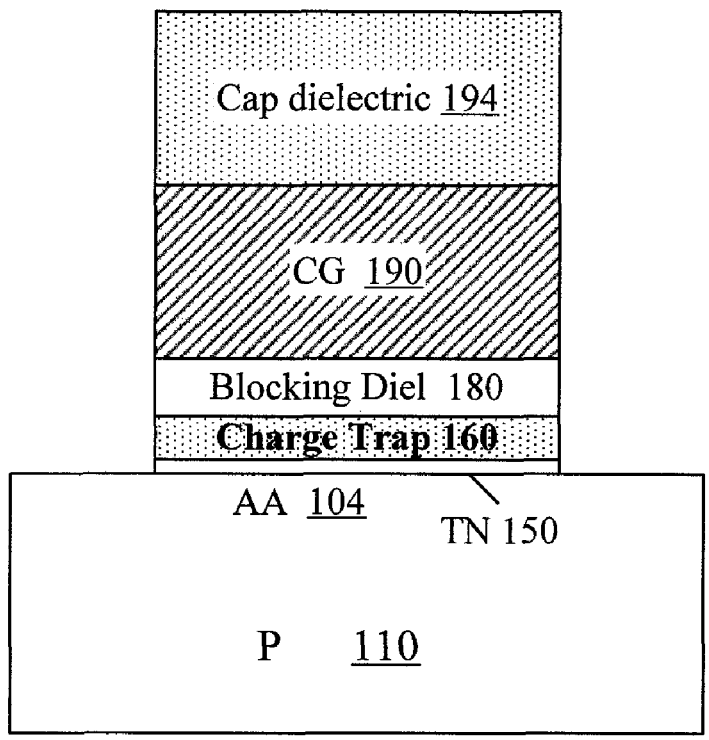
FIGS. 1, 2, 3, 4A show vertical cross sections of nonvolatile memories at different stages of fabrication.
Figure 2:
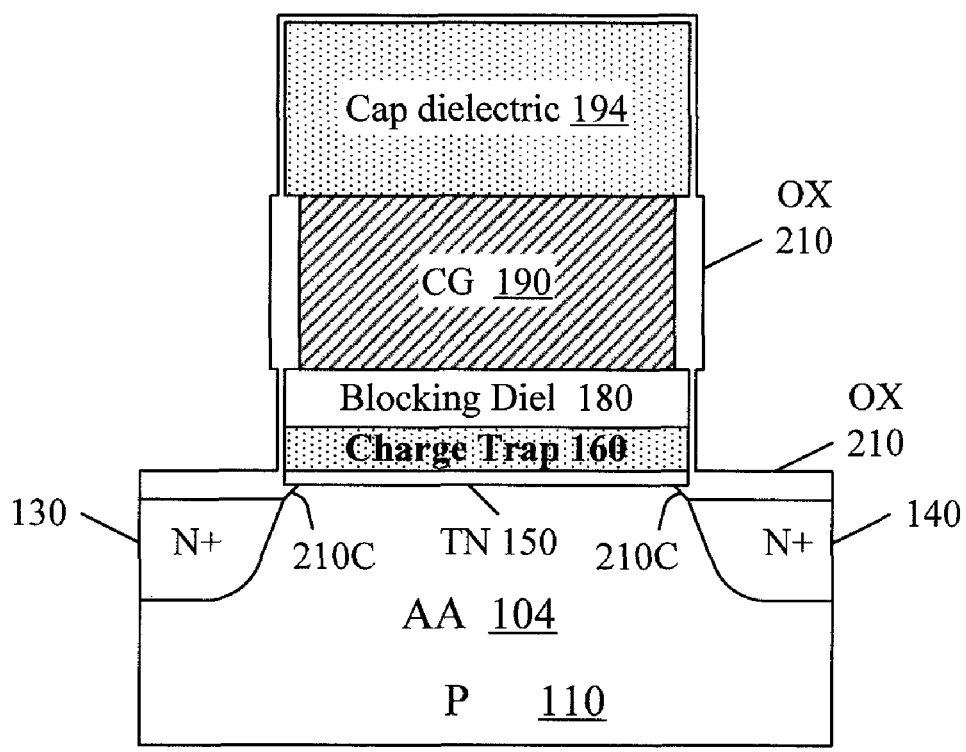
Figure 3:
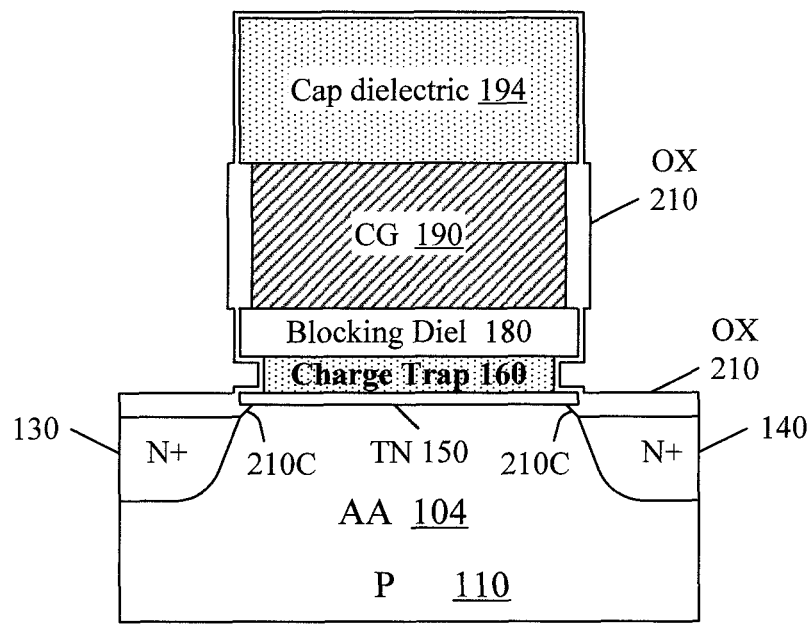
Figure 6A:
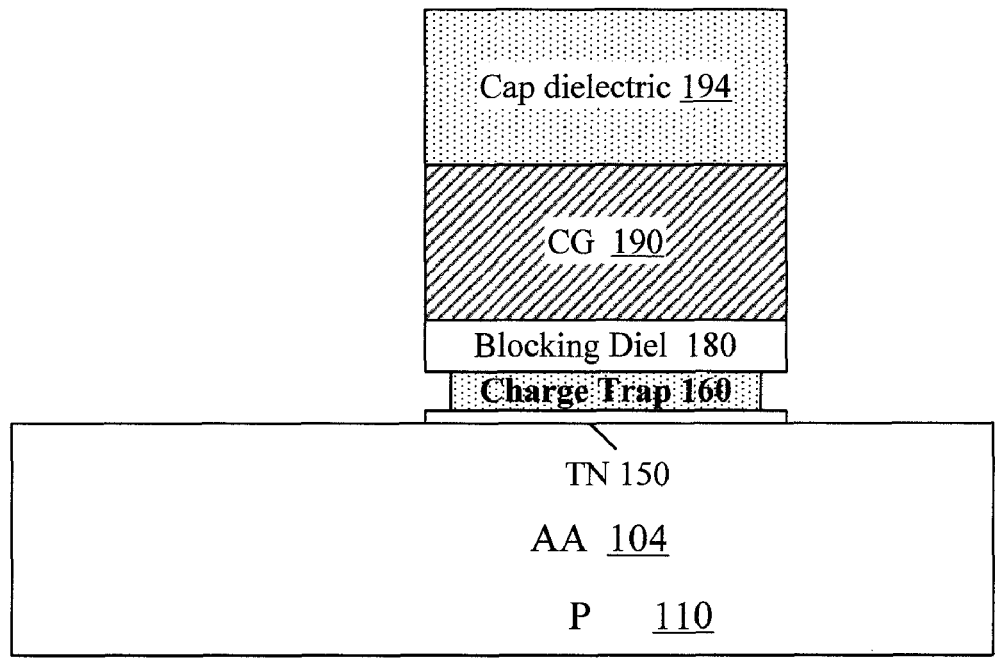
FIG. 6A shows a vertical cross section of a nonvolatile memory in the process of fabrication.
Figure 6B:
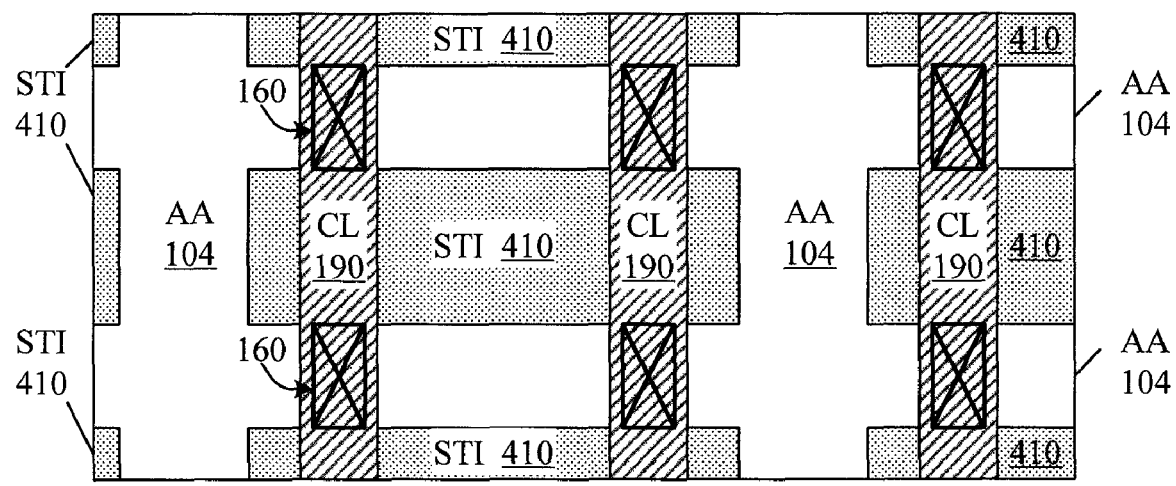
FIG. 6B is a top view of the nonvolatile memory of FIG. 6A in the process of fabrication.

As shown in FIGS. 6A (vertical cross section by plane A-A' marked in FIG. 4B), 6B (top view), trapping dielectric 160 is recessed by a lateral etch, possibly as described above in connection with FIG. 3 or by some other kind of etch. In some embodiments, trapping dielectric 160 is laterally recessed by 20-60 Å at each edge of control gate 190. For example, in some embodiments, the initial width of each stack in the view of FIG. 5A is 180 Å, and the final width is 160 Å, i.e. dielectric 160 is recessed by 10 Å at each edge.

Figure 7A:
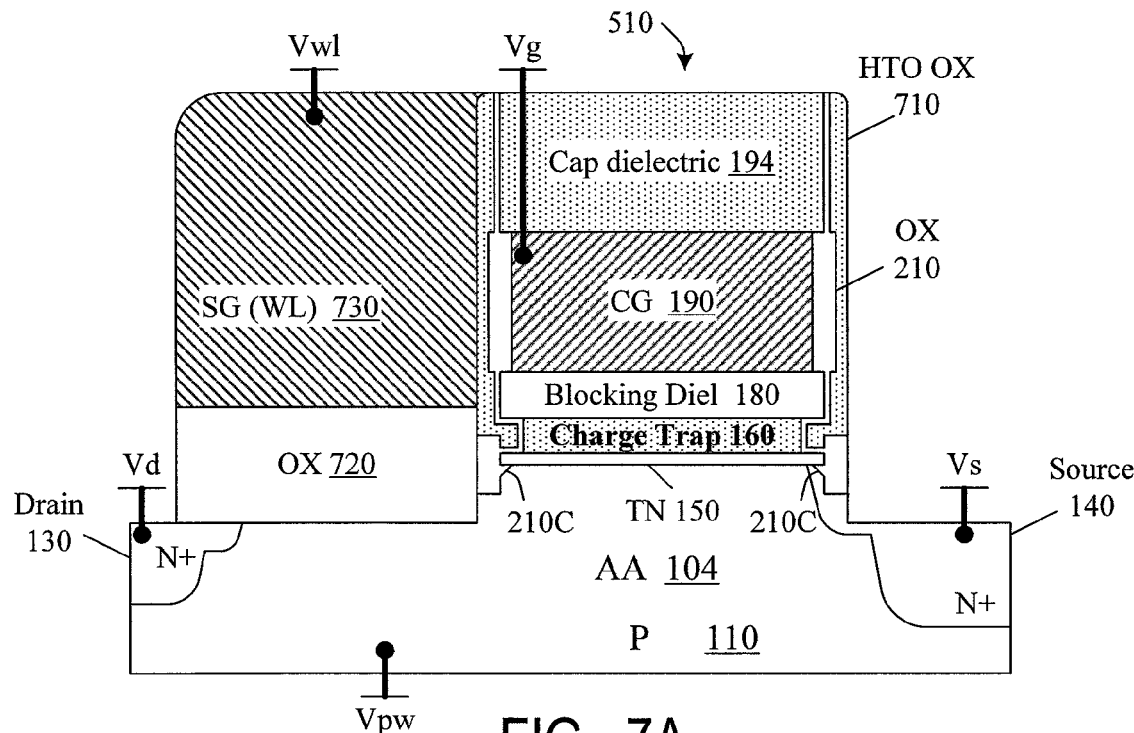
FIG. 7A shows a vertical cross section of a nonvolatile memory in the process of fabrication.

Silicon dioxide 210 (FIG. 7A) is grown over the structure as described above in connection with FIG. 3, to an exemplary thickness of 60 Å. Oxide 210 may encroach laterally to underneath the edges of control gate 190 as shown at 210C and explained above in connection with FIG. 3.

Silicon dioxide 710 is deposited by high temperature oxidation (HTO) to an exemplary thickness of 60 Å, and is etched anisotropically to provide spacers over oxide 210 over the sidewalls of stacks 510. Oxide 710 fills the areas adjacent to charge trapping dielectric 160 under the edges of control gates 190. The etch of oxide 710 is extended to remove the exposed portions of oxide 210 and expose the substrate 110.

Figure 7B:
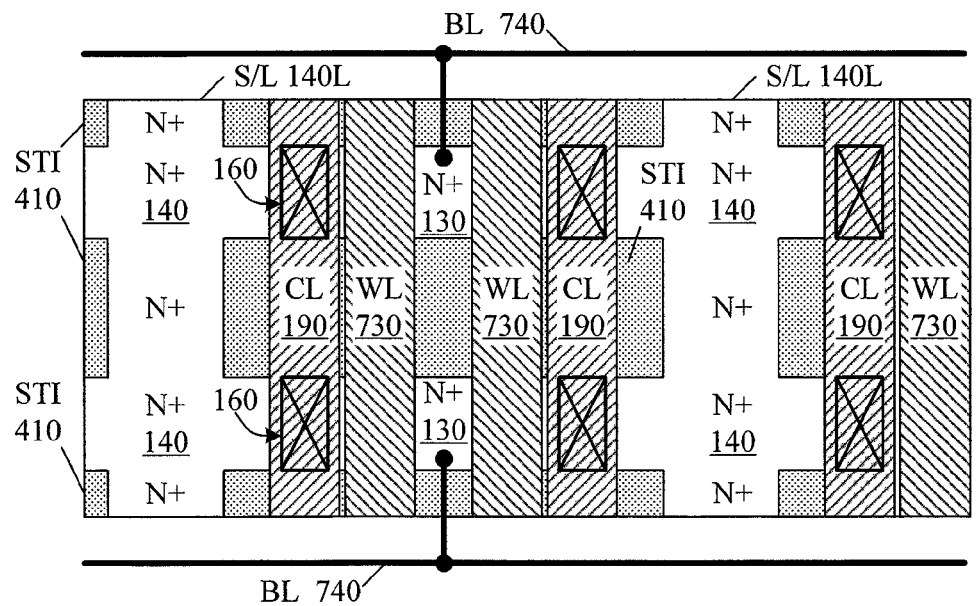
FIG. 7B is a top view of the nonvolatile memory of FIG. 7A in the process of fabrication.

Silicon dioxide 720 is thermally grown to an exemplary thickness of 80-200 Å (possibly 100-150 Å, e.g. 120 Å) to provide gate oxide for the select gates. Doped polysilicon 730 (e.g. P+) is conformally deposited and etched anisotropically to provide polysilicon spacers over the sidewalls of each stack 510. A masked etch removes the spacers on one side (the source side) of each sidewall. The remaining spacers provide wordlines shown in the top view FIG. 7B. Each wordline 730 provides the select gates to one row of memory cells. (Different wordlines can be interconnected in some embodiments, or can be independently drivable.)

The exposed portions of oxide 720 (i.e. the portions not underlying the wordlines 730) are etched away. This etch may also remove at least some of the silicon dioxide (not shown) from the exposed portions of regions 410. N+dopant implantation steps form source lines 140L which include source regions 140, and also form drain regions 130. Each of source regions 140 and drain regions 130 is shared by two adjacent memory cells in one column, and each source line 140L includes source regions 140 for one row of memory cells. See e.g. U.S. Pat. No. 6,355,524 B1 issued Mar. 12, 2002 to Tuan et al. and incorporated herein by reference, disclosing a floating gate NOR type memory array.

The memory fabrication can be completed using known techniques. In particular, bitlines 740 (schematically shown in FIG. 7B) can be formed, each bitline interconnecting the drain regions 130 in each column of memory cells.

Figure 8A:
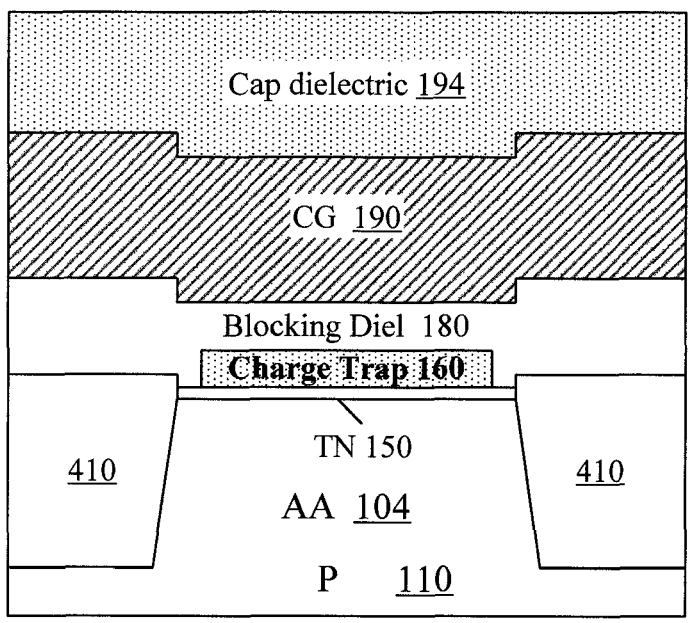
FIG. 8A shows a vertical cross section of a nonvolatile memory in the process of fabrication.
Figure 8B:
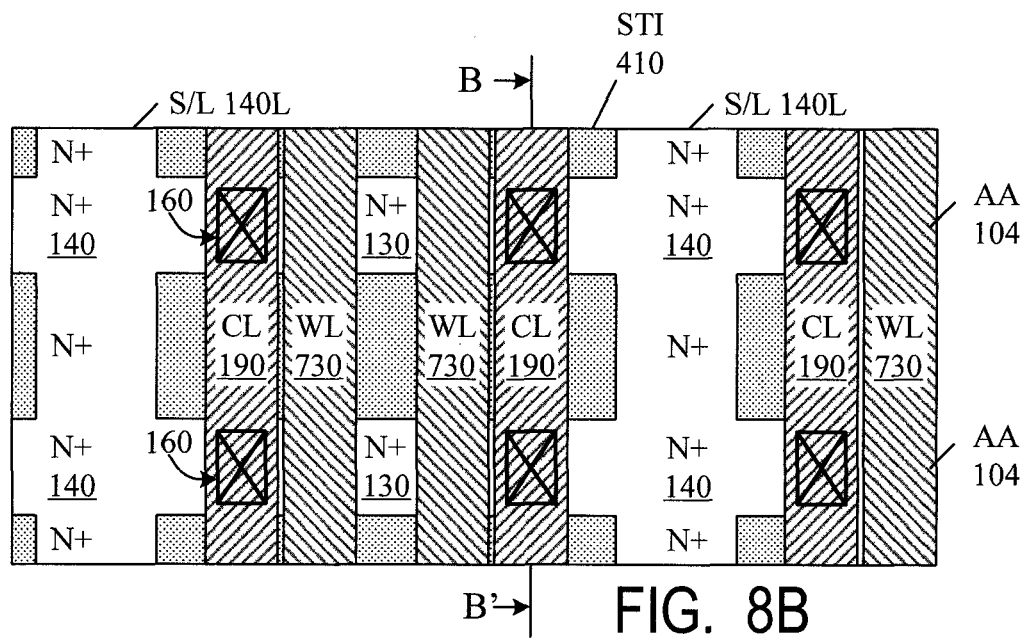
FIG. 8B is a top view of the nonvolatile memory of FIG. 8A in the process of fabrication.

FIGS. 8A, 8B show another embodiment. FIG. 8A is a vertical cross section in the wordline direction, passing through control gate line 190. The cross section plane is shown as B-B' in the top view FIG. 8B. This embodiment is identical to the embodiment of FIGS. 7A, 7B except that charge-trapping dielectric 160 is recessed at the edges of active areas 104 adjacent to field areas 410. FIG. 8B shows the same features as in FIG. 7B except for the bitlines. In the cross section B-B', the regions 410 are filled with dielectric, e.g. silicon dioxide, which may be formed by STI, LOCOS, or some other technique as explained above. After the stage of FIGS. 4A, 4B but before the stage of FIGS. 5A, 5B (i.e. before the deposition of blocking dielectric layer 180), charge-trapping dielectric 160 is recessed away from regions 410 as shown in FIG. 8A. The recess can be achieved by a lateral wet etch using the same mask (not shown) as was used to pattern the dielectric 160 to obtain the structure of FIG. 4B. The remaining fabrication steps can be as for the memory of FIGS. 7A, 7B. Blocking dielectric 180 fills the areas between charge-trapping dielectric 160 and the edges of regions 410.

Figure 9:
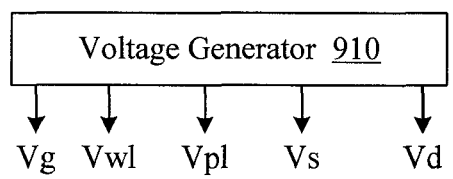
FIG. 9 is a block diagram of a voltage generator for some embodiments of nonvolatile memories of the present invention.

Exemplary operating voltages are shown in Table 1 below. All the voltages are given in volts. "PGM" means programming. Symbols Vg, Vwl, Vpw, Vs, Vd are marked in FIG. 7A. These symbols denote the respective voltages on control gate line 190, wordline 730, the P well in substrate 110, source line 140, and drain region 130 (i.e. the corresponding bitline 740). The voltages are generated by a voltage generator 910 (FIG. 9) in response to signals indicating the desired operation (programming, erase or read) and the address of the selected cell. Vcc=1.8V to 3.3V. Programming is performed by source side hot carrier injection. In this embodiment, source lines 140L are grouped in pairs; each pair consists of adjacent source lines that are tied together (i.e. permanently shorted together) to reduce the number of source-line contacts. The corresponding four control gate lines 190 are also tied together. The programming voltages for an unselected cell depend on the cell's position relative to the selected cell. In the Vd column, the notation "Vcc/0" means that the drain voltage is 0V if the cell is in the same column (same bitline) as the selected cell, and the voltage is Vcc in the other columns.

The erase is by channel direct tunneling; in this operation, four rows are erased whose control gates 190 are tied together. "Vcc+" means Vcc or higher. The unselected rows have their wordlines 730 and control gate lines 190 biased to Vcc or higher (possibly to the Vpw voltage of 7V) to avoid erasing the unselected cells. For the read operation, the dash ("-") means "don't care". These voltages do not limit the invention.

The invention is not limited to the embodiments described above. For example, each of tunnel dielectric 150 and charge-trapping dielectric 160 may include multiple layers of different materials. See e.g. U.S. patent application no. published as no. 2006/0261401 A1 on Nov. 23, 2006, filed by Bhattacharyya, and U.S. Pat. No. 6,936,884 B2 issued Aug. 30, 2005 to Chae et al., both incorporated herein by reference. The invention is not limited to the memory structures and fabrication methods described above except as defined by the appended claims.

Figure 10:
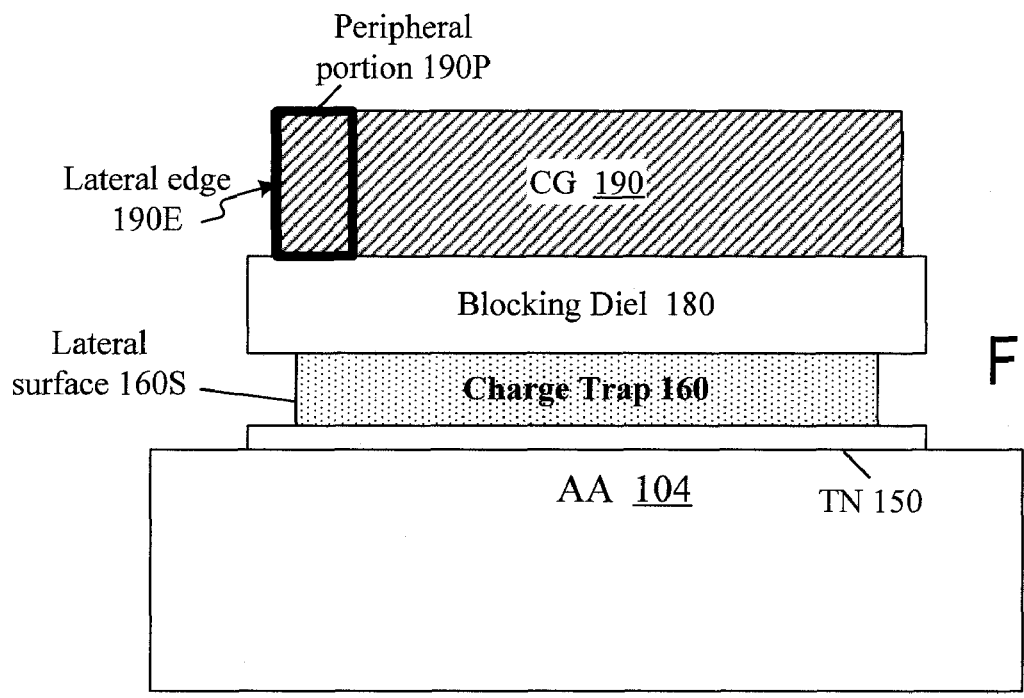
FIGS. 10, 11, 12 are vertical cross sections illustrating memory features according to some embodiments of the present invention.
Figure 11:
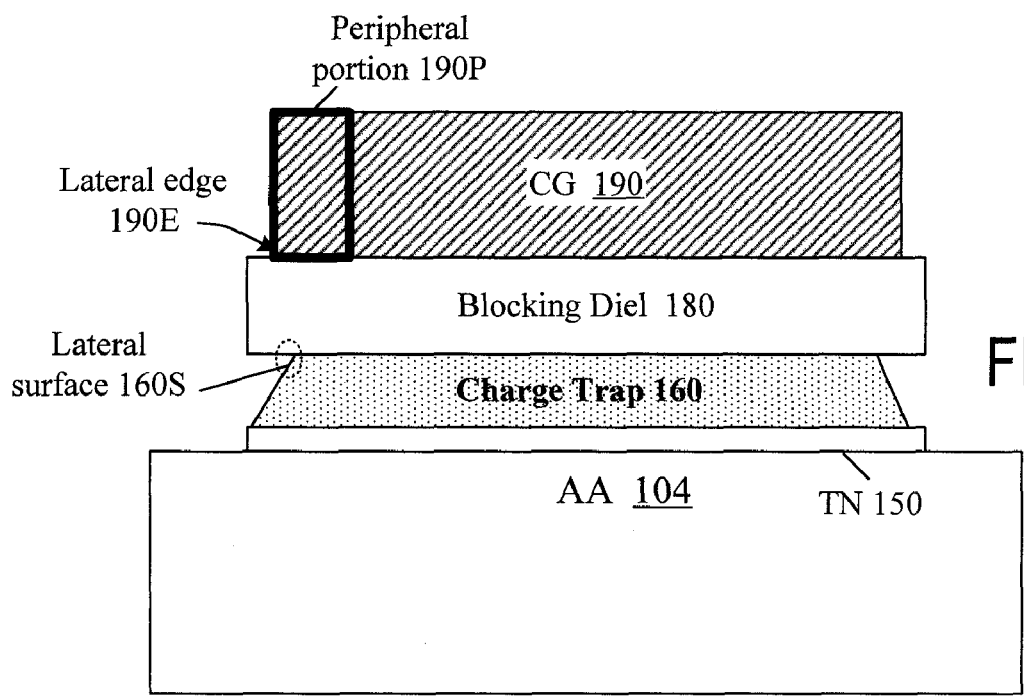

Some embodiments provide a nonvolatile memory cell comprising an active area formed in a semiconductor region. The active area comprises the memory cell's source/drain regions and the memory cell's channel region. The memory cell comprises a first conductive gate (e.g. control gate 190) overlying the active area and having a peripheral portion, e.g. portion 190P in the enlarged diagrams of FIGS. 10, 11, which show some features of FIGS. 7A, 8A. In FIGS. 10, 11, the peripheral portion 190P is shown at the left edge 190E of control gate 190, but could be at the right edge. The peripheral portion has a lateral edge. This could be the left or right edge in FIGS. 7A, 10. For example, this could be the edge 190E. The term "edge" may refer to the entire vertical lateral surface of gate 190P, or may refer to the bottom edge of the vertical surface. The memory cell comprises a charge-trapping dielectric for storing electric charge to define a state of the memory cell, the charge trapping dielectric being positioned between the active area (e.g. 104) and the first conductive gate (e.g. 190). The charge-trapping dielectric has a lateral surface (shown as surface 160S in FIGS. 10, 11) underlying the peripheral portion of the first conductive gate but laterally recessed away from under the lateral edge of the first conductive gate. In FIG. 10, the lateral surface 160S is the entire left vertical surface of charge trapping dielectric 160. In FIG. 11, the left surface of charge trapping dielectric 190 is not vertical. A non-vertical profile could be achieved by a suitable etching process and/or by forming charge trapping dielectric 190 as a combination of layers of different materials. The top part of the lateral surface is recessed away from under the lateral edge of the control gate, but the bottom part underlies the lateral edge of the control gate and may even protrude beyond the lateral edge (thus not even underlying the peripheral portion of control gate). Thus, in FIG. 11, lateral surface 160S is only the top part of the entire lateral surface of charge trapping dielectric.

TABLE 1

|  | Selected cell | | | | | Unselected cell | | | | |
| --- | --- | --- | --- | --- | --- | --- | --- | --- | --- | --- |
|  | Vg | Vwl | Vpw | Vs | Vd | Vg | Vwl | Vpw | Vs | Vd |
|  | | | | | | Same WL as selected cell: | | | | |
| PGM | 8.5 V | 1.2 | 0 | 5 | 0 | 8.5 | 1.2 | 0 | 5 | Vcc |
|  | | | | | | CG tied to CG of selected cell: | | | | |
|  | | | | | | 8.5 | −1 | 0 | 5 | Vcc/0 |
|  | | | | | | Remaining cells: | | | | |
|  | | | | | | 0 | 0 | 0 | 0 | Vcc/0 |
| Erase | −3 | Float | 7 | Float | Float | Vcc+ | Vcc+ | 7 | Float | Float |
| Read | Vcc | Vcc | 0 | 0 | 1 | — | — | — | — | 0 |

In some embodiments (e.g. in FIGS. 7A, 10 but not FIG. 11), the charge-trapping dielectric is absent underneath the lateral edge of the first conductive gate.

In some embodiments (e.g. FIG. 7A), the lateral edge is an edge of a bottom surface of the first conductive gate.

In some embodiments (e.g. FIGS. 7B, 8B), the lateral edge extends in a direction transverse to the length of the channel region.

In some embodiments, the memory cell further comprises a second conductive gate (e.g. select gate 730) overlying a portion of the active area adjacent to said lateral edge of the first conductive gate but insulated from the first conductive gate.

Figure 12:
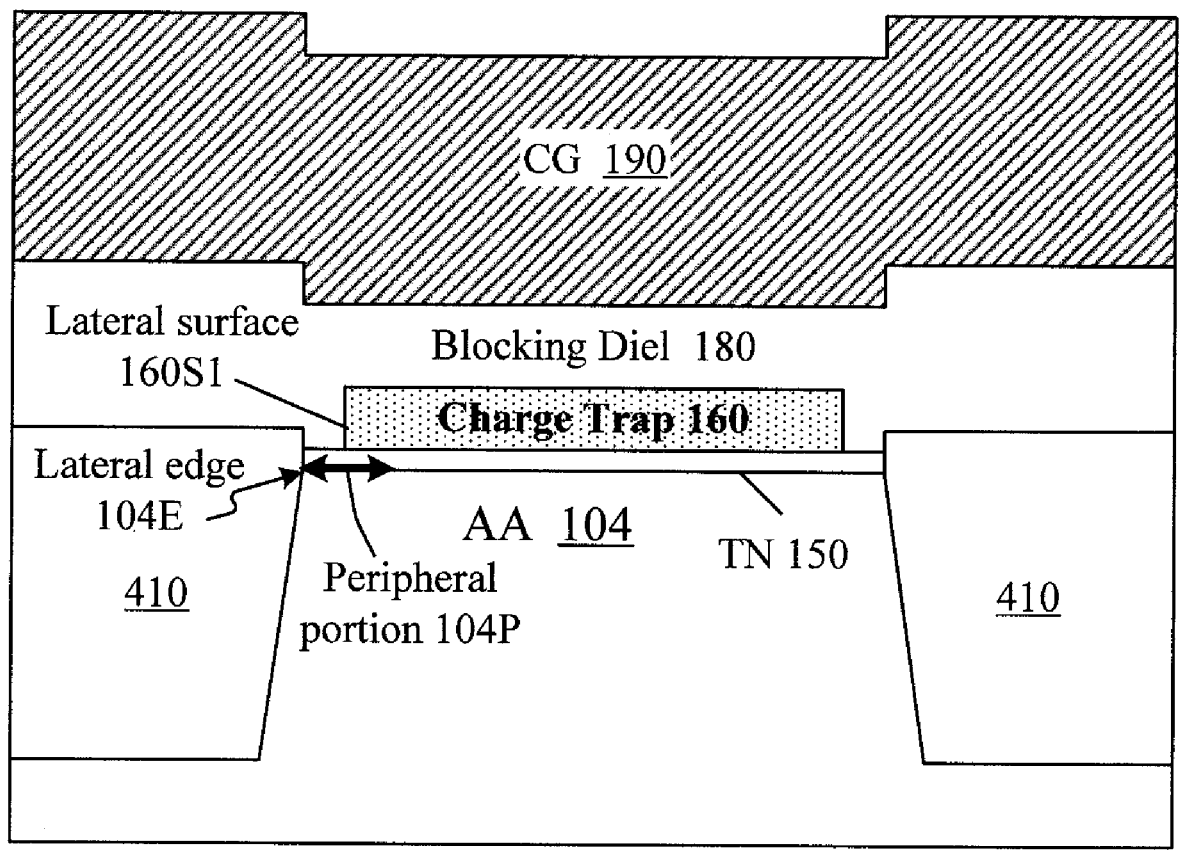

Some embodiments (e.g. FIGS. 8A, 8B, and FIG. 12 showing an enlarged view of some features of FIG. 8A) provide a nonvolatile memory cell comprising an active area formed in a semiconductor substrate and comprising source/drain regions and a channel region. The active area has a top surface having a peripheral portion (e.g. portion 104P in FIG. 12) whose lateral edge (e.g. left edge 104E) borders on a substrate isolation region (e.g. region 410). The memory cell comprises a first conductive gate (e.g. 190) overlying at least the peripheral portion of the active area; and a charge-trapping dielectric for storing electrical charge to define a state of the memory cell, the charge trapping dielectric being positioned between the active area and the first conductive gate, the charge-trapping dielectric having a lateral surface (e.g. 160S1) overlying the peripheral portion of the active area but laterally recessed away from above the lateral edge of the active area. As in FIG. 11, the lateral surface 160S1 of the charge trapping dielectric does not have to be vertical, and can be only part of the entire lateral surface of charge-trapping dielectric 160. The entire lateral surface may have other parts which are not recessed away from above the lateral edge of the active area.

In some embodiments (e.g. FIG. 12), the charge trapping dielectric is absent above the lateral edge of the active area.

In some embodiments, the feature explained above in connection with FIG. 8A is not combined with the feature explained above in connection with FIG. 7A, i.e. charge-trapping dielectric 150 is laterally recessed away from isolation region 410 but not from below any edge of control gate 190.

The invention is defined by the appended claims.

The invention claimed is:

1. A nonvolatile memory cell comprising:
   an active area formed in a semiconductor substrate and comprising source/drain regions and a channel region, wherein the active area's top surface's lateral edge borders on a substrate isolation region of the semiconductor substrate;
   a first conductive gate overlying the active area and, in top view, reaching the lateral edge; and
   a charge-trapping dielectric for storing electrical charge to define a state of the memory cell, the charge trapping dielectric being positioned between the active area and the first conductive gate;
   wherein everywhere underneath the first conductive gate, the charge-trapping dielectric is laterally recessed away from above the lateral edge everywhere where the lateral edge borders on the substrate isolation region.

2. The nonvolatile memory cell of claim 1 further comprising a tunnel dielectric between the charge-trapping dielectric and the active area.

3. The memory cell of claim 2 wherein the charge trapping dielectric is absent above the lateral edge of the active area.

4. The nonvolatile memory cell of claim 2 wherein the tunnel dielectric is silicon dioxide at most 2.5 nm thick.

5. The nonvolatile memory cell of claim 2 in combination with circuitry for providing a negative voltage on the first conductive gate relative to and at least a portion of the active area to transfer electrons across the charge-trapping dielectric.

6. The nonvolatile memory cell of claim 5 wherein the electrons are transferred via direct tunneling.

7. The nonvolatile memory cell of claim 5 wherein the circuitry is also for providing a positive voltage on the first conductive gate relative to the channel region while providing a voltage difference between the source/drain regions to inject electrons from the active area into the charge-trapping dielectric.

8. The memory cell of claim 1 wherein the first conductive gate is part of a conductive gate line providing first conductive gates to a plurality of nonvolatile memory cells.

9. The nonvolatile memory cell of claim 1 further comprising a second conductive gate overlying a portion of the active area adjacent to the first conductive gate but insulated from the first conductive gate.

10. A method for manufacturing the nonvolatile memory cell of claim 2, the method comprising forming the active area, the charge-trapping dielectric and the first conductive gate.

11. The nonvolatile memory cell of claim 1 wherein:
    the first conductive gate has a peripheral portion at a lateral edge of the first conductive gate, the peripheral portion overlying the active area; and
    the charge-trapping dielectric has a lateral surface underlying the peripheral portion of the first conductive gate but laterally recessed away from under the lateral edge of the first conductive gate.

12. The nonvolatile memory cell of claim 11 wherein the charge-trapping dielectric is absent underneath the lateral edge of the first conductive gate.

13. The nonvolatile memory cell of claim 11 wherein the lateral edge of the first conductive gate is an edge of a bottom surface of the first conductive gate.

14. The nonvolatile memory cell of claim 11 wherein the lateral edge of the first conductive gate extends in a direction transverse to a length of the channel region.

15. The nonvolatile memory cell of claim 11 further comprising a tunnel dielectric between the charge-trapping dielectric and the active area.

16. The nonvolatile memory cell of claim 2 further comprising blocking dielectric between the charge-trapping dielectric and the first conductive gate.

17. The nonvolatile memory cell of claim 16 wherein the change-trapping dielectric is made of a different material than each of the tunnel dielectric and the blocking dielectric.

18. The nonvolatile memory cell of claim 16 wherein the blocking dielectric is in physical contact with the first conductive gate, and wherein the tunnel dielectric is in physical contact with the active area.

19. The nonvolatile memory cell of claim 16 wherein the substrate isolation region is one of a plurality of substrate isolation regions in the semiconductor substrate, and each said substrate isolation region borders on a lateral edge of the top surface of the active area; and
    the charge-trapping dielectric is laterally recessed away from each said lateral edge.

20. The nonvolatile memory cell of claim 15 further comprising a second conductive gate overlying a portion of the active area adjacent to said lateral edge of the first conductive gate but insulated from the first conductive gate.

21. A method for operating the nonvolatile memory cell of claim 2, the method comprising providing a positive voltage on the first conductive gate relative to the active area to cause transfer of electrons from the charge-trapping dielectric to the active area through the tunnel dielectric.

22. The method of claim 21 wherein the tunnel dielectric is silicon dioxide at most 2.5 nm thick.

23. A method for manufacturing the nonvolatile memory cell of claim 7, the method comprising forming the active area, the charge-trapping dielectric and the first conductive gate.

* * * * *